(12) United States Patent
Wang et al.

(10) Patent No.: US 11,869,544 B2
(45) Date of Patent: Jan. 9, 2024

(54) ELECTRONIC DEVICE WITH PARALLEL BACKPLANES AND STORAGE DEVICE WITH PARALLEL BACKPLANES

(71) Applicant: HUAWEI TECHNOLOGIES CO., LTD., Shenzhen (CN)

(72) Inventors: Na Wang, Chengdu (CN); Can Chen, Chengdu (CN); Yinzhong Tang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 414 days.

(21) Appl. No.: 17/331,964

(22) Filed: May 27, 2021

(65) Prior Publication Data

US 2021/0287720 A1     Sep. 16, 2021

Related U.S. Application Data (63) Continuation of application No. PCT/CN2019/103308, filed on Aug. 29, 2019.

(30) Foreign Application Priority Data

Dec. 4, 2018 (CN) .......................... 201811474416.1

(51) Int. Cl.
*G11B 33/12* (2006.01)
*H05K 7/02* (2006.01)
(Continued)

(52) U.S. Cl.
CPC .......... *G11B 33/128* (2013.01); *H05K 7/026* (2013.01); *H05K 7/1424* (2013.01);
(Continued)

(58) Field of Classification Search
CPC .... G11B 33/128; H05K 7/026; H05K 7/1424; H05K 7/1462; H05K 7/20136; H05K 2201/044
(Continued)

(56) References Cited

U.S. PATENT DOCUMENTS

| 6,683,793 B1 | 1/2004 | Campbell et al. |
| 2010/0177465 A1 | 7/2010 | Lu |

(Continued)

FOREIGN PATENT DOCUMENTS

| CN | 1991677 A | 7/2007 |
| CN | 101984599 A | 3/2011 |

(Continued)

*Primary Examiner* — Andargie M Aychillhum
(74) *Attorney, Agent, or Firm* — Maier & Maier, PLLC (57) ABSTRACT

An electronic device with parallel backplanes and a storage device with parallel backplanes. The electronic device includes a front inserting assembly, a rear inserting assembly, and a backplane assembly. The backplane assembly is connected to the front inserting assembly and the rear inserting assembly. The backplane assembly includes a plurality of backplanes arranged in parallel at intervals, the front inserting assembly includes a plurality of first units whose arrangement direction is the same as an arrangement direction of the backplanes, and the rear inserting assembly includes a plurality of second units whose arrangement direction intersects the arrangement direction of the backplanes. The backplane assembly is provided with the structure including the plurality of backplanes arranged in parallel at intervals and the channel between adjacent backplanes. In addition, the first units and the second units are connected to two opposite sides of the backplanes, respectively.

20 Claims, 7 Drawing Sheets

(51) Int. Cl.
*H05K 7/14* (2006.01)
*H05K 7/20* (2006.01)

(52) U.S. Cl.
CPC ....... *H05K 7/1462* (2013.01); *H05K 7/20136* (2013.01); *H05K 2201/044* (2013.01)

(58) Field of Classification Search
USPC .......................................................... 361/788
See application file for complete search history.

(56) References Cited

U.S. PATENT DOCUMENTS

| | | | |
|---|---|---|---|
| 2013/0107489 A1 | 5/2013 | Wen et al. | |
| 2014/0192448 A1 | 7/2014 | Coffey | |
| 2015/0163951 A1* | 6/2015 | Rossman | H02G 3/081 |
| | | | 361/788 |
| 2015/0282319 A1* | 10/2015 | Salzman | H05K 1/141 |
| | | | 361/788 |
| 2016/0095262 A1 | 3/2016 | Ding et al. | |

FOREIGN PATENT DOCUMENTS

| | | |
|---|---|---|
| CN | 102510707 A | 6/2012 |
| CN | 103503590 A | 1/2014 |
| CN | 103687449 A | 3/2014 |
| CN | 104640417 A | 5/2015 |
| CN | 204539679 U | 8/2015 |
| CN | 107154856 A | 9/2017 |
| CN | 107396593 A | 11/2017 |
| CN | 207118172 U | 3/2018 |
| CN | 109788697 A | 5/2019 |
| JP | H0250496 A | 2/1990 |
| JP | H05275148 A | 10/1993 |
| JP | 2008251067 A | 10/2008 |
| JP | 5355829 B1 | 11/2013 |
| WO | 2008070814 A2 | 6/2008 |

\* cited by examiner

ELECTRONIC DEVICE WITH PARALLEL BACKPLANES AND STORAGE DEVICE WITH PARALLEL BACKPLANES

CROSS-REFERENCE TO RELATED APPLICATIONS

This application is a continuation of International Patent Application No. PCT/CN2019/103308, filed on Aug. 29, 2019, which claims priority to Chinese Patent Application No. 201811474416.1, filed on Dec. 4, 2018. The disclosures of the aforementioned applications are hereby incorporated by reference in their entireties.

TECHNICAL FIELD

The embodiments relate to the field of electronic devices, and in particular, to an electronic device with parallel backplanes and a storage device with parallel backplanes.

BACKGROUND

Currently, an electronic system such as a memory, a server, a router, or a switch including an electronic device with parallel backplanes usually includes several basic circuits that are connected to each other, interact with each other, and used as one circuit to provide specific functions. Most of the functional circuits are deployed and integrated on a specific module, different modules are connected to the backplanes, and electrical connections between the functional circuits are realized through the backplanes. To avoid damage caused by an excessively high temperature to electronic components inside an electronic device and to ensure normal operation of the electronic device, a good heat dissipation effect needs to be achieved in the electronic device.

SUMMARY

The embodiments aim to provide an electronic device with parallel backplanes, to achieve a good heat dissipation effect in the electronic device.

The electronic device includes a backplane assembly, a front inserting assembly, and a rear inserting assembly. The backplane assembly is connected to the front inserting assembly and the rear inserting assembly. The backplane assembly includes a plurality of backplanes arranged in parallel at intervals, and there is a channel between adjacent backplanes. The front inserting assembly includes a plurality of first units arranged in parallel at intervals, an arrangement direction of the first units is the same as an arrangement direction of the backplanes, and the first unit is connected to one side of the backplane. The rear inserting assembly includes a plurality of second units arranged in parallel at intervals, an arrangement direction of the second units intersects the arrangement direction of the backplanes, and each of the second units is connected to one side of the backplane that is opposite to the first unit, so that the first unit is connected to the second unit through the backplane.

That the first unit is connected to one side of the backplane means that the first unit is communicatively connected to the backplane, so that a signal such as a data signal and/or a control signal can be transmitted between the first unit and the backplane. That the second unit is connected to the backplane also means that the second unit is communicatively connected to the backplane, so that a signal such as a data signal and/or a control signal can be transmitted between the second unit and the backplane. Therefore, that the first unit is connected to the second unit through the backplane means that a signal is transmitted between the first unit and the second unit through the backplane.

In some embodiments, the backplane includes a substrate and a connection line disposed on the substrate. That the first unit is communicatively connected to the second unit through the backplane means that the first unit is connected to the connection line on the backplane, the second unit is connected to the connection line on the backplane, and a signal such as a data signal and/or a control signal is transmitted between the first unit and the connection line and between the connection line and the second unit. The connection line can be used to transmit an electrical signal or an optical signal. When a signal transmitted between the first unit and the backplane is an electrical signal, the connection line may be a metal cable. When a signal transmitted between the first unit and the backplane is an optical signal, the connection line may be made of a material such as an optical fiber used to transmit the optical signal.

"Arranged in parallel at intervals" means that a plurality of structures are disposed side by side with a particular interval between adjacent structures. For example, "the plurality of backplanes are arranged in parallel at intervals" means that the plurality of backplanes are disposed side by side with a particular interval between adjacent backplanes; "the plurality of first units are arranged in parallel at intervals" means that the plurality of first units are disposed side by side with a particular interval between adjacent first units; and "the plurality of second units are arranged in parallel at intervals" means that the plurality of second units are disposed side by side with a particular interval between adjacent second units.

"An arrangement direction of the plurality of second units intersects the arrangement direction of the plurality of backplanes" means that the arrangement direction of the second units and the arrangement direction of the backplanes are not the same direction, but form a particular angle.

The backplane assembly has a structure including the plurality of backplanes arranged in parallel at intervals and the channel between adjacent backplanes, so that an airflow on two sides of the backplane assembly can easily pass through the channel. This avoids blocking from the backplane assembly to the airflow and achieves a good heat dissipation effect in the electronic device. In addition, the direction of the backplanes that are arranged in parallel at intervals is the same as the direction of the first units that are arranged in parallel at intervals, and the first units and the second units are connected to two opposite sides of the backplanes, respectively. Therefore, there is no need to reserve a clearance, and density of the first units and/or the second units in the electronic device can be increased. In other words, compared with the prior art, more first units and second units can be connected through the backplane assembly, and an operating capability of the electronic device can be improved.

In the embodiments, each of the first units is connected to one side of the backplanes, and each of the second units is connected to all the backplanes, so that each of the second units can be connected to all the first units through the backplanes. When the electronic device is a memory, the first units are storage units such as hard disks, the second units are controllers, and each of the controllers can access all the hard disks.

Further, in the embodiments, each of the backplanes is connected to all the second units. Therefore, all the second units can be connected to each of the first units through the backplanes. When the electronic device is a memory, the first units are storage units such as hard disks, the second units are controllers, and all the controllers can access a same hard disk, so that the memory can be shared by a plurality of controllers.

Further, in the embodiments, the first units connected to adjacent backplanes are staggered in a height direction of the backplanes. For example, the first units connected to the adjacent backplanes are staggered in the height direction of the backplanes, so that a distance between the adjacent backplanes can be as small as possible, to reduce an area occupied by the backplane assembly.

An electronic component is disposed on the backplane, and the electronic component may be a micro switch, a memory chip, or the like used to extend functions of the backplane.

In some embodiments, the backplane includes a first side and a second side opposite to the first side, the front inserting assembly is connected to the first side, and the rear inserting assembly is connected to the second side. The backplane is plate-shaped. The front inserting assembly is connected to the first side, and the rear inserting assembly is connected to the second side. Therefore, there is no need to reserve a clearance, and density of the first units and/or the second units in the electronic device is increased.

Each first side is disposed with a first connector, each second side is disposed with a second connector, a side of the first unit facing the backplane is disposed with a first connection port, and the first connection port is detachably connected to the first connector; and a side of the second unit facing the backplane is disposed with a second connection port, and the second connection port is detachably connected to the second connector. The first connector is detachably connected to the first unit, so that the first unit can be easily detachably connected to the backplane, to facilitate replacement and maintenance of the first unit. Similarly, the second connector is detachably connected to the second unit, so that the second unit can be easily detachably connected to the backplane, to facilitate replacement and maintenance of the second unit, and each of the second units can be connected to all the backplanes.

In some embodiments, both the first connector and the second connector are mounted on the backplane in a through-board manner. Through-board mounting means that all pins of the first connector and the second connector need to penetrate the backplane for mounting, so that the first connector and the second connector can be stably fastened on the backplane.

In some embodiments, the backplane assembly further includes a fixed frame with openings on two sides, the openings face the front inserting assembly and the rear inserting assembly, respectively, and the backplane is detachably fastened in the fixed frame. The backplanes are fastened in the fixed frame, so that locations of the backplanes can be relatively stable. In addition, the backplane can be detachably fastened in the fixed frame, so that it is convenient to take the backplane out from the fixed frame. This facilitates subsequent maintenance of the backplane.

In some embodiments, an inner wall of the fixed frame is disposed with a plurality of card slots arranged at intervals, and an edge of each of the backplanes is secured in corresponding card slot. The card slot is used to stably secure the backplane at a fixed location in the fixed frame, to ensure that the locations of the backplanes are relatively stable.

Further, in some embodiments, a buffer member is disposed between the inner wall of the card slot and the backplane. When the electronic device is subject to an external force, the buffer member can provide a buffer for the backplane, to avoid damage to the backplane due to a relatively large force generated between the backplane and the fixed frame.

In some other embodiments, the fixed frame may be made of a flexible material, so that when the electronic device is subject to an external force, the fixed frame can provide a buffer for the backplane, to avoid damage to the backplane.

Further, in some embodiments, the backplane may be disposed with a hole, and holes on adjacent backplanes are connected, so that an airflow can pass through the backplanes, to implement even heat dissipation at all locations in the backplane assembly.

In some embodiments, projections of the holes on the adjacent backplanes overlap on a plane parallel to any of the backplanes. In other words, holes on the backplanes are connected in the arrangement direction of the backplanes, so that an airflow can pass through all the backplanes more smoothly.

The electronic device further includes a chassis. The backplane assembly, the front inserting assembly, and the rear inserting assembly are all accommodated in the chassis. The chassis protects the backplane assembly, the front inserting assembly, and the rear inserting assembly that are located inside the chassis.

In some embodiments, the fixed frame is fastened in the chassis, so that the backplane can be stably disposed in the chassis.

Further, a heat dissipation fan is disposed on a wall of the chassis. The heat dissipation fan is located on one side of the rear inserting assembly, and an airflow generated by the heat dissipation fan sequentially passes through the rear inserting assembly, the backplane assembly, and the front inserting assembly. The heat dissipation fan is used to achieve a better heat dissipation effect.

The embodiments further provide a storage device with parallel backplanes to achieve a good heat dissipation effect in the storage device. The storage device is an embodiment of the electronic device.

In some embodiments, the storage device may include a plurality of backplanes arranged in parallel at intervals, a plurality of interface cards arranged in parallel at intervals, and a plurality of controllers arranged in parallel at intervals. There is a channel between adjacent backplanes. An arrangement direction of the plurality of interface cards is the same as an arrangement direction of the backplanes, the interface card is connected to one side of the backplane, and the interface card is configured to connect a hard disk. An arrangement direction of the plurality of controllers intersects the arrangement direction of the plurality of backplanes, and each of the controllers is connected to one side of the backplane that is opposite to the interface card, so that the controller is connected through the backplane to the hard disk connected to interface card.

The plurality of backplanes are arranged in parallel at intervals, so that there is a channel between adjacent backplanes, and an airflow can easily pass through the channel. This avoids blocking from the backplanes to the airflow and achieves a good heat dissipation effect in the storage device. In addition, the direction of the backplanes that are arranged in parallel at intervals is the same as the direction of the hard disks that are arranged in parallel at intervals, and the hard disks and the controllers are connected to two opposite sides of the backplanes, respectively. Therefore, there is no need to reserve a clearance, and density of the hard disks and/or the controllers in the electronic device can be increased.

Compared with the prior art, more hard disks and controllers can be connected through the backplanes, and an operating capability of the storage device can be improved.

In some embodiments, each of the controllers is connected to all the backplanes. For example, each of the controllers can access any hard disk through the backplanes and the interface cards connected to the backplanes.

In addition, in some embodiments, each backplane can be connected to all the controllers. For example, the plurality of controllers can access a same hard disk through the backplanes and the interface cards connected to the backplanes, so that sharing by the plurality of controllers is implemented.

In some embodiments, the interface cards connected to adjacent backplanes are staggered in a height direction of the backplanes, so that a distance between the adjacent backplanes can be as small as possible, to reduce an area occupied by the backplanes.

In some embodiments, an electronic component is disposed on the backplane, and the electronic component may be a micro switch or a memory chip to extend functions of the backplane.

In some embodiments, the controller includes a processor, a memory, and a power module. The processor is configured to process service data on the hard disk connected to the interface card. The memory is in signal connection to the processor, to provide a cache for the processor. The power module is electrically connected to the processor and the interface card, to provide an operating voltage for the processor and the hard disk connected to the interface card.

The hard disk includes a power conversion module, an internal control module, and a data storage module. The data storage module is configured to store data; the internal control module is configured to process a signal of the controller and manage the hard disk; and the power conversion module is electrically connected to the power module, the internal control module, and the data storage module, to convert a voltage of the power module and provide the voltage to the internal control module and the data storage module.

In some other embodiments, the storage device may include a plurality of backplanes arranged in parallel at intervals, a plurality of hard disks arranged in parallel at intervals, and a plurality of controllers arranged in parallel at intervals. There is a channel between adjacent backplanes. An arrangement direction of the plurality of hard disks is the same as an arrangement direction of the backplanes, and the hard disk is directly connected to one side of the backplane. An arrangement direction of the plurality of controllers intersects the arrangement direction of the plurality of backplanes, and each of the controllers is connected to one side of the backplane that is opposite to the hard disk, so that the hard disk is connected to the controller through the backplane. Compared with the storage device in the foregoing embodiments, there is no interface card in the storage device in the foregoing embodiments, and the hard disk is directly connected to the backplane. An arrangement and locations of the plurality of hard disks in the storage device, a connection relationship between the hard disks and the backplanes, and the like are the same as an arrangement and locations of the plurality of interface cards in the storage device, and a connection relationship between the interface cards and the backplanes in the storage device in the foregoing embodiments.

BRIEF DESCRIPTION OF DRAWINGS

To describe the solutions in the embodiments more clearly, the following briefly describes the accompanying drawings. It is clear that the accompanying drawings in the following descriptions show merely some embodiments. A person of ordinary skill in the art may still derive other drawings from these accompanying drawings without creative efforts.

DETAILED DESCRIPTION OF THE EMBODIMENTS

The following clearly and completely describes the solutions in the embodiments with reference to the accompanying drawings. Arrows in the figures show airflow directions.

In the embodiments, it should be noted that terms "mounting" and "connection" should be interpreted in a broad sense unless otherwise expressly specified and limited. For example, a connection may be a fixed connection, a detachable connection, or an integrated connection. Alternatively, a connection may be a mechanical connection or an electrical connection or may mean mutual communication. Alternatively, a connection may be a direct connection, or an indirect connection through an intermediate medium, or may be a connection between two elements or an interaction relationship between two elements. A person of ordinary skill in the art may interpret specific meanings of the foregoing terms in the embodiments according to specific cases.

Figure 1:
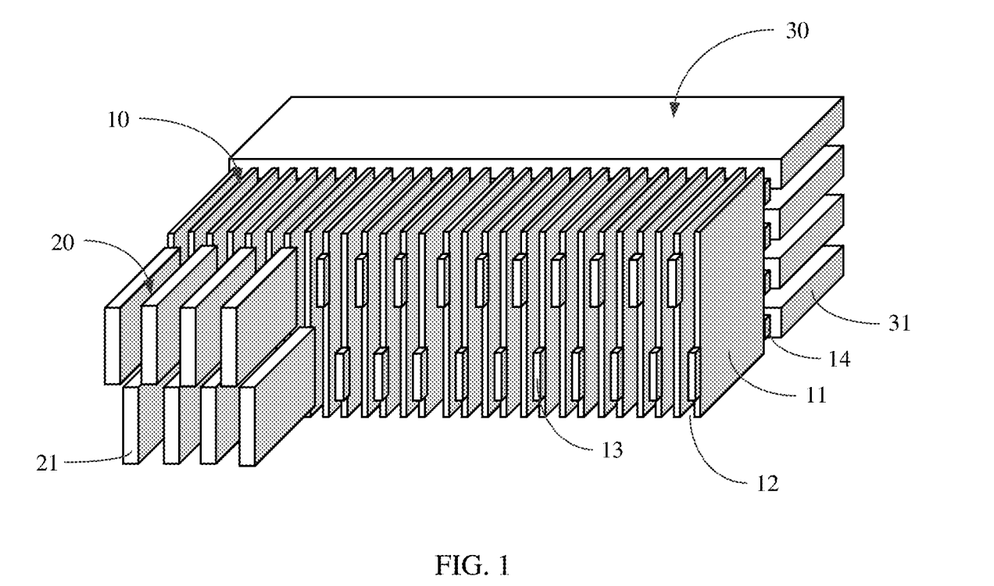
FIG. 1 is a partial schematic structural diagram of an electronic device with parallel backplanes according to an embodiment.
Figure 2:
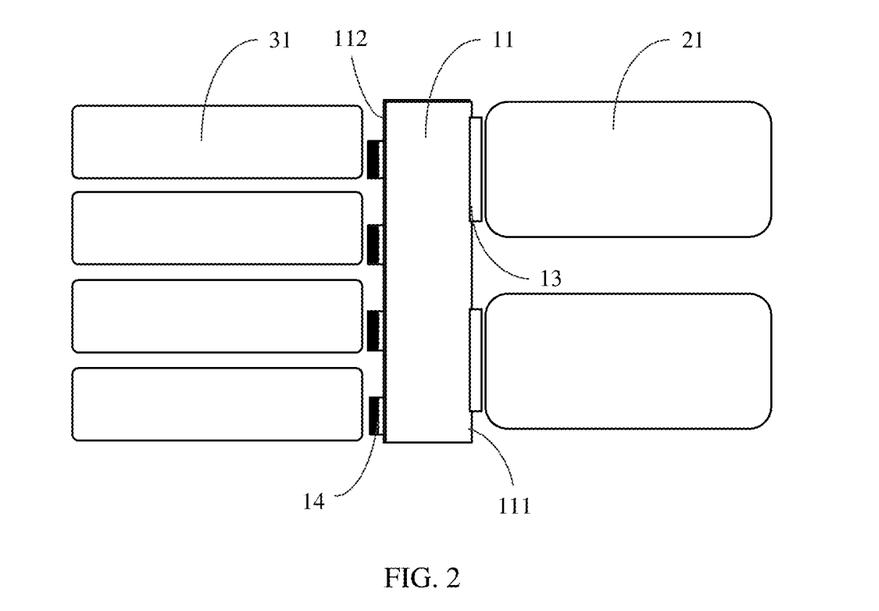
FIG. 2 is a left view of an electronic device with parallel backplanes according to an embodiment.

As shown in FIG. 1 and FIG. 2, the embodiments provide an electronic device with parallel backplanes. The electronic device includes a backplane assembly 10, a front inserting assembly 20, and a rear inserting assembly 30. The front inserting assembly 20 and the rear inserting assembly 30 are located on two sides of the backplane assembly 10, respectively. The backplane assembly 10 is connected to the front inserting assembly 20 and the rear inserting assembly 30, so that a data signal and/or a control signal is transmitted between the front inserting assembly 20 and the rear inserting assembly 30.

The backplane assembly 10 includes a plurality of backplanes 11 arranged in parallel at intervals. The backplane 11 is plate-shaped, a plurality of backplanes 11 are disposed in parallel, and an arrangement direction of the backplanes 11 and a plane on which the backplanes 11 are located form an angle. In an embodiment, the arrangement direction of the plurality of backplanes 11 is perpendicular to the plane on which the backplanes 11 are located. In other words, a line of centers of the plurality of backplanes 11 is perpendicular to the plane on which the backplanes 11 are located. That the plurality of backplanes 11 are arranged in parallel at intervals means that the plurality of backplanes 11 are disposed side by side with a particular interval between adjacent backplanes 11 and there is a channel 12 between the adjacent backplanes 11. The front inserting assembly 20 and the rear inserting assembly 30 are located at two ends of an airflow direction in the channel 12, respectively. The channel 12 is disposed between the adjacent backplanes 11, so that an airflow can smoothly pass through the two sides of the backplane assembly 10 through the channel 12. This avoids blocking from the backplanes 11 to the airflow and achieves a good heat dissipation effect in the electronic device. Compared with a manner in which a through-hole is disposed on the backplane 11 to implement air ventilation and heat dissipation between the front inserting assembly 20 and the rear inserting assembly 30 on the two sides of the backplane 11 through the through-hole on the backplane 11, in this manner, no through-hole needs to be disposed on the backplane 11, and therefore a difficulty in manufacturing the backplane 11 is reduced. In addition, the following problem does not arise: the airflow between the front inserting assembly 20 and the rear inserting assembly 30 is blocked by the backplane 11 and a heat dissipation effect is poor because a quantity of functional units in the front inserting assembly 20 and/or the rear inserting assembly 30 increases, an area occupied by the backplanes 11 after the front inserting assembly 20 and/or the rear inserting assembly 30 are connected to the backplanes 11 is increased, and a size of the through-hole on the backplane 11 needs to be decreased.

The backplane 11 includes a substrate and a connection line disposed on the substrate, so that the front inserting assembly 20 is connected to the rear inserting assembly 30 through the connection line. In the embodiments, the front inserting assembly 20 is communicatively connected to the rear inserting assembly 30. For example, after the front inserting assembly 20 and the rear inserting assembly 30 are connected through the connection line, information such as data information and/or control information can be transmitted between the front inserting assembly 20 and the rear inserting assembly 30 through the transmission line. In the embodiments, the connection line may be a metal cable, to transmit an electrical signal carrying information such as data information and/or control information. In some embodiments, the connection line may alternatively be an optical fiber or the like used to transmit an optical signal, to transmit an optical signal carrying information such as data information and/or control information. In this embodiment, the backplane 11 is a rectangular PCB board, and the connection line may be a metal cable. It may be understood that the backplane 11 in this application may alternatively be in any shape. This is not limited herein. In some embodiments, various electronic components may be further disposed on an outer surface of the backplane 11 to extend functions of the backplane 11. For example, the electronic component may be disposed with a micro switch. The micro switch is used to control connection of a connection line on which the micro switch is located. Alternatively, the electronic component may be a micro storage chip or the like. The storage chip stores manufacturing information of a backplane 11 on which the storage chip is located, to facilitate subsequent maintenance and replacement.

The backplane 11 includes a first side 111 and a second side 112 opposite to the first side 111. The front inserting assembly 20 is connected to the first side 111, and the rear inserting assembly 30 is connected to the second side 112. The front inserting assembly 20 and the rear inserting assembly 30 are usually connected to the backplane 11 through connectors, and the connectors are usually mounted on the backplane 11 in a through-board manner. For example, pins of the connectors need to penetrate the backplane. In the prior art, the front inserting assembly 20 and the rear inserting assembly 30 are usually fastened on two sides of the backplane 11 in a thickness direction of the backplane 11. As a result, in the prior art, to ensure stable and effective mounting of the front inserting assembly 20 and the rear inserting assembly 30 on the backplane 11, a clearance needs to be reserved when the front inserting assembly 20 and the rear inserting assembly 30 are connected to the backplane 11. However, in the embodiments, the front inserting assembly 20 and the rear inserting assembly 30 are located on two sides of the backplane 11 in a non-thickness direction of the backplane 11. Therefore, there is no need to reserve a clearance for the front inserting assembly 20 and the rear inserting assembly 30, and density of first units 21 and/or second units 31 in the electronic device can be increased.

A first connector 13 and a second connector 14 are connected to the backplane 11. For example, the first connector 13 is connected to the first side 111, and the second connector 14 is connected to the second side 112. Each of the backplanes 11 can be connected to one or more first connectors 13 disposed at intervals and one or more second connectors 14 disposed at intervals. A plurality of first connectors 13 are disposed at intervals along an extension direction of the first side 111, and a plurality of second connectors 14 are disposed at intervals along an extension direction of the second side 112.

Referring to FIG. 1 again, in some embodiments, the first connectors 13 on adjacent backplanes 11 are staggered in the extension direction of the first side 111. In other words, orthographic projections of the first connectors 13 on the adjacent backplanes 11 do not overlap in the arrangement direction of the backplanes 11. It may be understood that, in some embodiments, the first connectors 13 on the adjacent backplanes 11 may alternatively be disposed adjacently. In other words, orthographic projections of the first connectors 13 on the adjacent backplanes 11 may alternatively overlap in the arrangement direction of the backplanes 11.

Referring to FIG. 1 and FIG. 2, the front inserting assembly 20 includes a plurality of first units 21 arranged in parallel at intervals. An arrangement direction of the first units 21 is the same as the arrangement direction of the backplanes 11, and each of the first units 21 is connected to one backplane 11. That the first unit 21 is connected to one side of the backplane 11 means that the first unit 21 is communicatively connected to the backplane 11, so that a signal can be transmitted between the first unit 21 and the backplane 11. In this embodiment, the first unit 21 is plate-shaped, each first unit 21 is disposed with a first connection port on the side facing the backplane, and the first connection port is detachably connected to the first connector 13, so that the first unit 21 can be easily detachably connected to the backplane 11, to facilitate replacement and maintenance of the first unit 21. In some embodiments, the first units 21 connected to the adjacent backplanes 11 are staggered in the extension direction of the first side 111. For example, the first units 21 connected to the adjacent backplanes 11 are staggered in a height direction of the backplanes 11, so that a distance between the adjacent backplanes 11 can be as small as possible, to reduce an area occupied by the backplane assembly 10. In an embodiment, the height direction of the backplanes 11 is the extension direction of the first side 111 and the second side 112. Because the first connectors 13 on the adjacent backplanes 11 are staggered, the first units 21 connected to the two adjacent backplanes 11 are staggered. In this embodiment, each of the backplanes 11 is connected to one of the first connectors 13, so that only one of the first units 21 is connected to each backplane 11. It may be understood that, in other embodiments, when each backplane 11 is connected to a plurality of first connectors 13 disposed at intervals, each backplane 11 may be connected to the plurality of first units 21, and the first units 21 are disposed at intervals, so that there is a gap between adjacent first units 21, and an airflow can pass through the gap to achieve a good heat dissipation effect.

Referring to FIG. 1 and FIG. 2, the rear inserting assembly 30 includes a plurality of second units 31 arranged in parallel at intervals. For example, an arrangement direction of the plurality of second units 31 intersects the arrangement direction of the plurality of backplanes 11. In other words, the arrangement direction of the plurality of second units 31 and the arrangement direction of the plurality of backplanes 11 form a particular angle. In an embodiment, the arrangement direction of the plurality of second units 31 is perpendicular to the arrangement direction of the plurality of backplanes 11. Each of the second units 31 is connected to one side of the backplane 11 that is opposite to the first unit 21. That the second unit 31 is connected to one side of the backplane 11 that is opposite to the first unit 21 means that the second unit 31 is communicatively connected to the backplane 11, so that a signal can be transmitted between the second unit 31 and the backplane 11. The first unit 21 and the second unit 31 are connected through the backplane 11, so that the first unit 21 and the second unit 31 can communicate with each other for transmission of a signal including but not limited to a data signal and/or a control signal. In an embodiment, the second unit 31 is plate-shaped, the second unit 31 is disposed with a second connection port on the side facing the backplane 11, and the second connection port is detachably connected to the second connection connector 14, so that the second unit 31 can be easily detachably connected to the backplane 11, to facilitate replacement and maintenance of the second unit 31. In the embodiments, each backplane 11 is connected to a plurality of second connectors 14 disposed at intervals, so that each backplane 11 can be connected to the plurality of second units 31 through the second connectors 14, and the second units 31 are disposed at intervals, so that there is a gap between adjacent second units 31, and an airflow can pass through the gap to achieve a good heat dissipation effect.

In some embodiments, each of the first units 21 is connected to one side of one backplane 11, and each of the second units 31 is connected to all the backplanes 11, so that each of the second units 31 can be connected to all the first units 21 through the backplanes 11. When the electronic device with parallel backplanes is a memory, the first units 21 may be storage units such as hard disks, and the second units 31 may be controllers, and each of the controllers can access all hard disks. The hard disks may be various types of hard disks, such as a solid state drive (SSD), a hybrid hard drive (HHD), and a conventional hard disk drive (HDD). For example, a plurality of second connection ports are disposed at intervals on a side of each of the second units 31 that faces the backplanes 11, and each of the second connection ports corresponds to one backplane 11 and is connected to a second connector 14 on the backplane 11, so that each of the second units 31 is communicatively connected to all the backplanes 11. It may be understood that, in other embodiments, each second unit 31 may alternatively be communicatively connected to some backplanes 11, so that all the second units 31 can be communicatively connected to some first units 21 through the backplanes 11. For example, second connection ports corresponding to second connectors 14 on several corresponding backplanes 11 in the backplane assembly 10 are disposed on a side of each of the second units 31 that faces the backplanes 11, and each of the second connection ports is connected to a second connector 14 on a corresponding backplane 11, so that each of the second units 31 is connected to several backplanes 11 in the backplane assembly 10.

Further, in the embodiments, each of the backplanes 11 is connected to all the second units 31. Therefore, all the second units 31 can be communicatively connected to each of the first units 21 through the backplanes 11 for transmission of a data signal and/or a control signal. When the electronic device with parallel backplanes is a memory, the first units 21 are storage units such as hard disks, the second units 31 are controllers, and all the controllers can access a same hard disk, so that the memory can be shared by a plurality of controllers. In the embodiment shown in FIG. 1, there are four controllers, so that the memory can be shared by the four controllers. The controllers are PCB boards or control chips having control circuits. The hard disks may be various types of hard disks, such as an SSD, an HHD, and a conventional hard disk drive HDD. For example, the second unit 31 is orthogonal to the backplane 11, and a length of the second unit 31 is greater than or equal to a length of the backplane assembly 10 in the arrangement direction of the backplanes 11, so that the second unit 31 intersects each of the backplanes 11 and is connected at a location at which the second unit 31 intersects the backplane 11. In this way, each of the backplanes 11 can be connected to all the second units 31. In an embodiment, several second connectors 14 are disposed at intervals on a side of each of the backplanes 11 that faces the second unit 31 and along the extension direction of the first side 111, and the second units 31 are one-to-one connected to the second connectors 14, so that each of the backplanes 11 is connected to all the second units 31. It may be understood that, in some embodiments, each of the backplanes 11 may alternatively be connected to several second units 31 in the rear inserting assembly 30. In other words, each of the backplanes 11 is not connected to all the second units 31 in the rear inserting assembly 30. In this way, the second unit 31 can be connected to a corresponding first unit 21 through the backplanes 11. For example, there are three backplanes 11 in the backplane assembly 10, and the three backplanes 11 are a backplane A, a backplane B, and a backplane C. The rear inserting assembly 30 has three second units 31, and the three second units 31 are a second unit D, a second unit E, and a second unit F. The backplane A is connected to the second unit D, the backplane B is connected to the second unit D and the second unit E, and the backplane C is connected to the second unit F and the second unit E.

Figure 3:
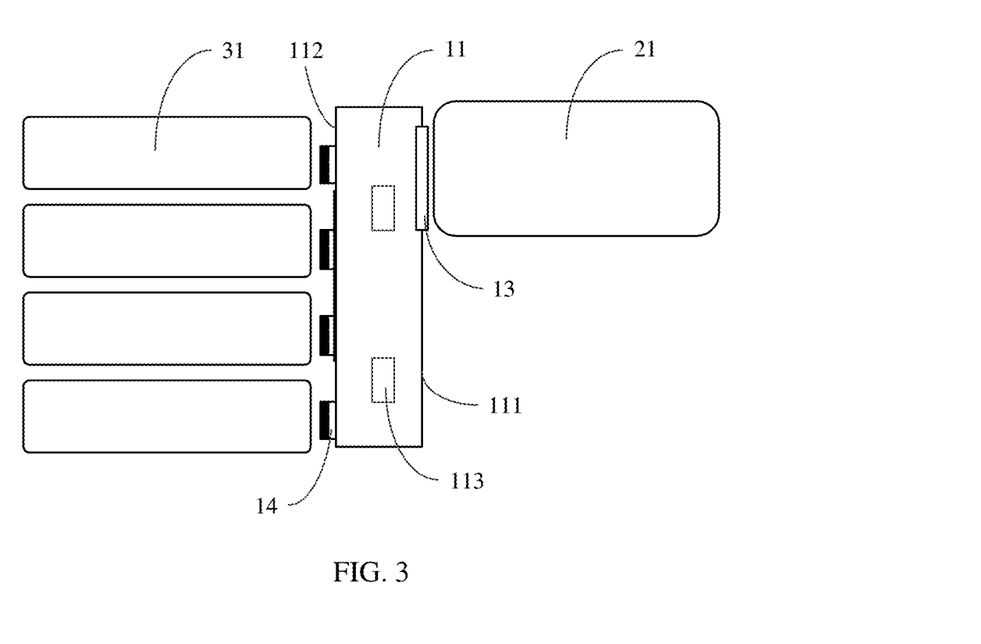
FIG. 3 is a left view of an electronic device with parallel backplanes according to another embodiment.

Referring to FIG. 3, in some embodiments, the backplane 11 may be disposed with a hole 113, and holes 113 on adjacent backplanes 11 are connected, so that an airflow can pass through all the backplanes 11, to implement even heat dissipation at all locations in the backplane assembly 10.

Further, in some embodiments, projections of the holes 113 on the adjacent backplanes 11 overlap on a plane parallel to any of the backplanes 11. In other words, holes 113 on the backplanes 11 are connected in the arrangement direction of the backplanes 11, so that an airflow can pass through all the backplanes 11 more smoothly. It may be understood that, in other embodiments, the holes 113 on the adjacent backplanes 11 are staggered in the arrangement direction of the backplanes 11. In other words, projections of the holes 113 on the adjacent backplanes 11 do not overlap on a plane parallel to any of the backplanes 11.

Figure 4:
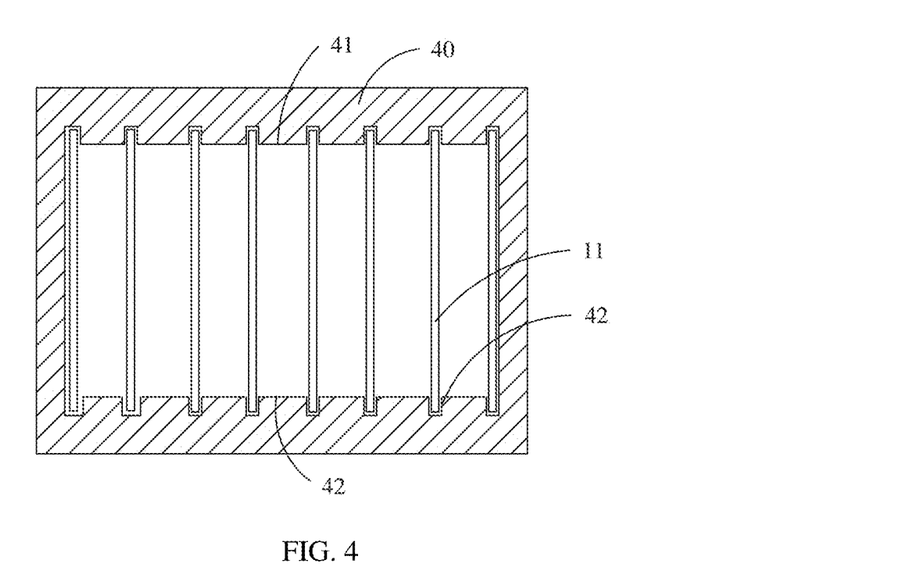
FIG. 4 is a schematic structural diagram of backplanes and a fixed frame in an electronic device with parallel backplanes according to an embodiment.
Figure 5:
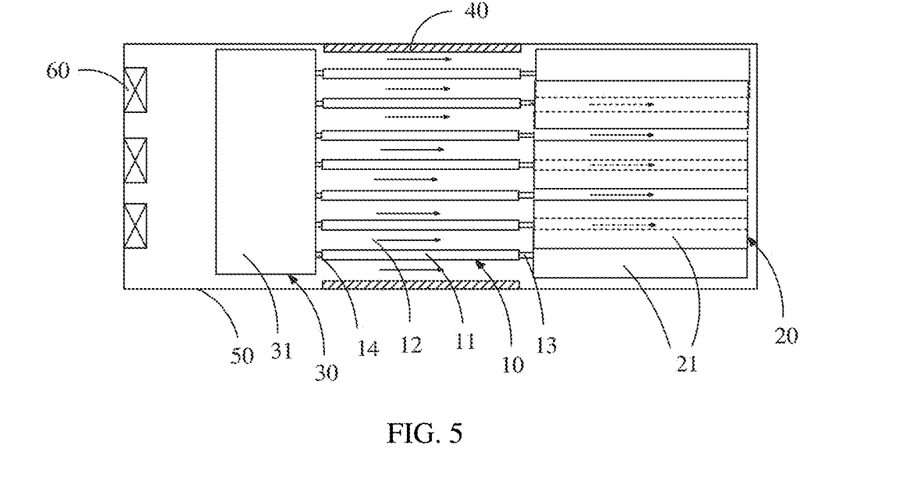
FIG. 5 is a schematic cross-sectional view of an electronic device with parallel backplanes according to another embodiment, where a plane parallel to a second unit plane is used as a cross-section, and an arrow indicates an airflow direction in the electronic device with the parallel backplanes.

Referring to FIG. 4 and FIG. 5, in the embodiments, the backplane assembly 10 further includes a fixed frame 40 with openings on two sides. The openings face the front inserting assembly 20 and the rear inserting assembly 30, respectively. The backplane 11 is detachably fastened in the fixed frame 40. The backplanes 11 are fastened in the fixed frame 40, so that locations of the backplanes 11 can be relatively stable. In addition, the backplane 11 can be detachably fastened in the fixed frame 40, so that it is convenient to take the backplane 11 out from the fixed frame 40. This facilitates subsequent maintenance of the backplane 11.

In some embodiments, the fixed frame 40 is a cuboid frame. For example, the cuboid frame is a cuboid frame surrounded by four square plates. In this embodiment, two opposite inner wall surfaces 41 of the cuboid frame are disposed with a plurality of card slots 42 arranged at intervals, and an edge of each of the backplanes 11 is secured in a corresponding card slot 42. The card slot 42 is used to stably secure the backplane 11 at a fixed location in the fixed frame 40, to ensure that the locations of the backplanes 11 are relatively stable. In some embodiments, the card slot 42 may be a sliding slot extending in a direction from the first side 111 to the second side 112, and the backplane 11 can be inserted into the card slot 42 along the card slot 42 from an opening on one side of the fixed frame 40. It may be understood that, in other embodiments, the card slot 42 may alternatively be a groove disposed on the inner wall 41 of the fixed frame 40, and the backplane 11 is disposed with a corresponding protrusion, so when the backplane 11 is fastened on the fixed frame 40, the protrusion on the backplane 11 is inserted into the groove.

The fixed frame 40 may be made of various materials such as metal and plastic. In some embodiments, the fixed frame 40 may be made of a flexible material such as plastic, so that when the electronic device is subject to an external force, the fixed frame 40 can provide a buffer for the backplane 11 to avoid damage to the backplane 11.

Figure 6:
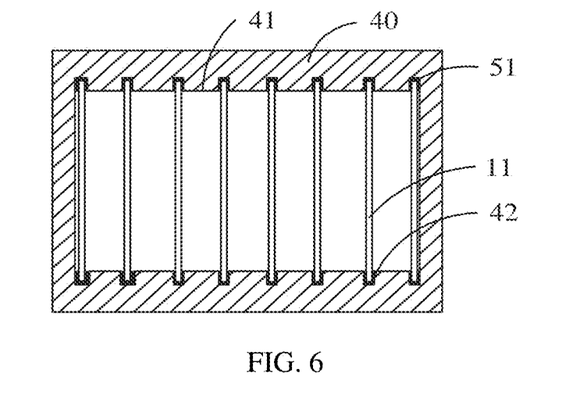
FIG. 6 is a schematic structural diagram of backplanes and a fixed frame in an electronic device with parallel backplanes according to another embodiment.

Further, referring to FIG. 6, in some embodiments, a buffer member 51 is disposed between the inner wall of the card slot 42 and the backplane 11. The buffer member 51 is used to fill in a gap between the backplane 11 and the inner wall of the card slot 42, so that the backplane and the fixed frame 40 are connected more stably. In addition, when the electronic device is subject to an external force, the buffer member 51 can provide a buffer for the backplane 11, to avoid damage to the backplane 11 due to a relatively large force generated between the backplane 11 and the fixed frame 40. In this embodiment, the buffer member 51 is a rubber member.

Referring to FIG. 5 again, the electronic device with parallel backplanes further includes a chassis 50. The front inserting assembly 20, the rear inserting assembly 30, and the backplane assembly 10 are all accommodated in the chassis 50. The chassis 50 protects the front inserting assembly 20, the rear inserting assembly 30, and the backplane assembly 10 that are located inside the chassis 50. In addition, in this embodiment, the fixed frame 40 is fastened in the chassis 50, so that the backplane 11 can be stably disposed in the chassis 50.

Further, a heat dissipation fan 60 is disposed on a wall of the chassis 50. The heat dissipation fan 60 is used to achieve a better heat dissipation effect. The heat dissipation fan 60 is located on one side of the rear inserting assembly 30, and an airflow, as shown by an arrow in FIG. 5, sequentially passes through the rear inserting assembly 30, the backplane assembly 10, and the front inserting assembly 20, to dissipate heat of the rear inserting assembly 30, the backplane assembly 10, and the front inserting assembly 20.

In the embodiments, the backplane assembly 10 has a structure including the plurality of backplanes 11 arranged in parallel at intervals and the channel 12 between adjacent backplanes 11, so that an airflow for heat dissipation can easily pass through the channel 12. This avoids blocking from the backplanes 11 to the airflow for heat dissipation and avoids impact of density of the first units 21 and/or the second units 31 in the electronic device with parallel backplanes on the airflow for heat dissipation. Compared with a manner in the prior art in which a through-hole is disposed on a backplane in an electronic device for heat dissipation, in this embodiment, an air ventilation effect in the electronic device is better, and a better heat dissipation effect is achieved in the electronic device. In addition, the first units 21 and the second units 31 are disposed on the first sides 111 and the second sides 112 of the backplanes 11, respectively, and therefore there is no need to reserve a clearance for the first units 21 and the second units 31 on the two sides of the backplanes 11. In this way, as many first units 21 and second units 31 as possible can be connected through the backplanes 11, density of the first units 21 and/or the second units 31 in the electronic device can be increased, and the following prior-art problem does not arise: a heat dissipation effect in the electronic device is poor because the density of the first units 21 and/or the second units 31 in the electronic device is increased and a size of the through-hole for heat dissipation on the backplane 11 needs to be decreased.

The electronic device may be a storage device, a server, a switch, a router, or the like. The electronic device is to be described in some embodiments below.

Figure 7:
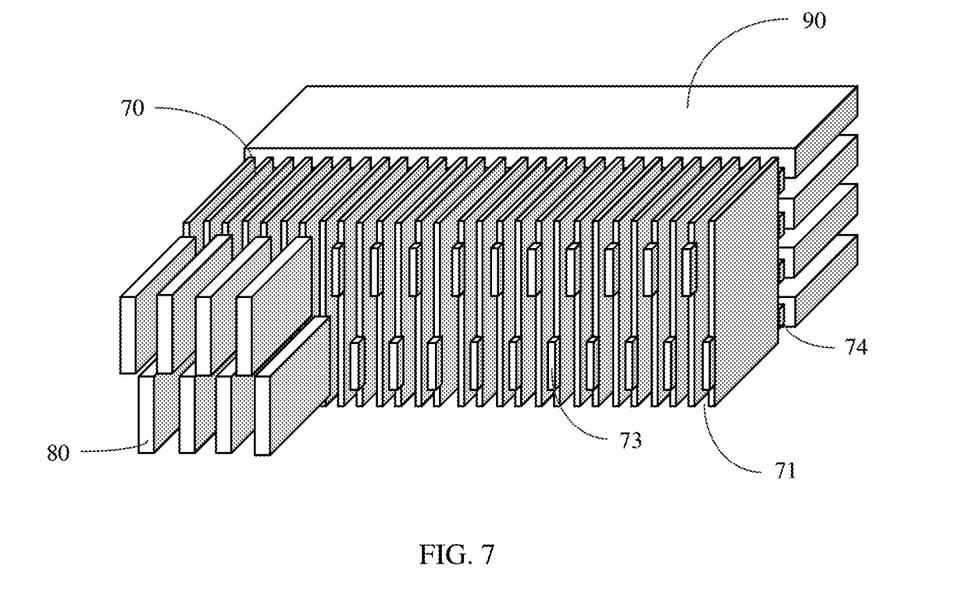
FIG. 7 is a partial schematic structural diagram of a storage device according to an embodiment.

Referring to FIG. 7, in some embodiments, an electronic device is a storage device. The storage device includes a backplane 70, a hard disk 80, and a controller 90. The backplane 70 is an embodiment of the backplane 11 in the electronic device shown in FIG. 1, the hard disk 80 is an embodiment of the first unit 21 in the electronic device shown in FIG. 1, and the controller 90 is an embodiment of the second unit 31 in the electronic device shown in FIG. 1. The hard disk 80 and the controller 90 are communicatively connected through the backplane 70, so that a data signal and/or a control signal is/are transmitted between the hard disk 80 and the controller 90. For example, in a data read/write scenario shown in FIG. 8, when a client needs to obtain data in the hard disk 80, the client sends a data reading instruction to the controller 90. After receiving the data reading instruction, the controller 90 sends a data obtaining instruction to the hard disk 80 through the backplane 70, to obtain the specified data from the hard disk 80. The specified data is sent to the controller 90 through the backplane 70, and then the specified data is sent to the client through the controller 90. When the client needs to store data into the hard disk 80, the client sends a data writing instruction to the controller 90, where the data writing instruction carries the to-be-stored data. After receiving the data writing instruction, the controller 90 obtains the to-be-stored data from the data writing instruction, and sends, through the backplane 70, the to-be-stored data to the hard disk 80 for storage.

Figure 9:
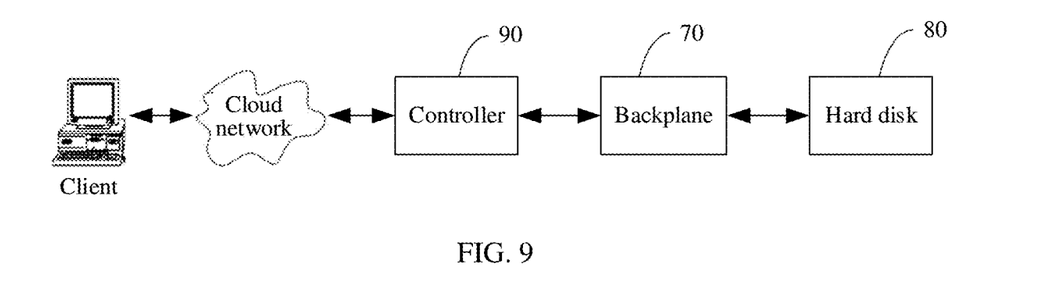
FIG. 9 is a schematic diagram of another application scenario of a storage device according to an embodiment.

Referring to FIG. 9, in another embodiment, a client sends a data reading instruction or a data writing instruction to the controller 90 over a cloud network. After the controller 90 receives the data reading instruction over the cloud network and obtains data from the corresponding hard disk 80, the controller 90 sends the data to the client over the cloud network. After the controller 90 receives the data writing instruction over the cloud network, the controller 90 obtains to-be-stored data from the data wiring instruction and stores the to-be-stored data in the corresponding hard disk 80.

Figure 8:
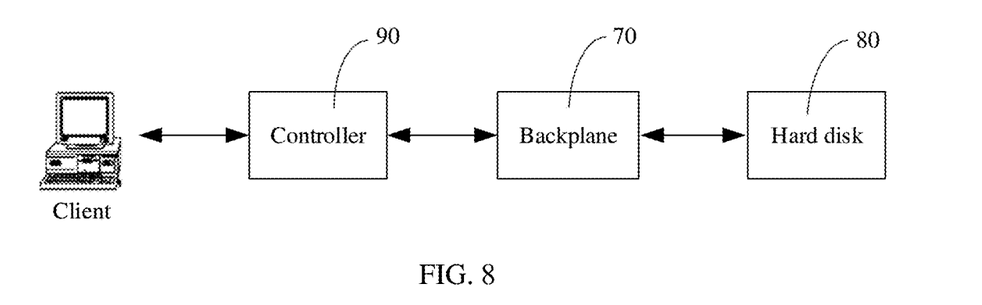
FIG. 8 is a schematic diagram of an application scenario of a storage device according to an embodiment.

It should be noted that in scenarios shown in FIG. 8 to FIG. 9, interaction between one client, one controller 90, and one hard disk 80 is merely used as an example. However, this should not constitute a limitation on an application scenario in the embodiments. In an actual data read/write scenario, a plurality of clients, a plurality of controllers 90, and a plurality of hard disks 80 may be included. For example, referring to FIG. 7, in some embodiments, a connection structure of the controller 90, the hard disk 80, and the backplane 70 in the storage device is the same as a connection structure of the second unit 31, the first unit 21, and the backplane 11 in FIG. 1, and there may be a plurality of controllers 90, backplanes 70, and hard disks 80. The plurality of backplanes 70 are arranged in parallel at intervals, and there is a channel 71 between adjacent backplanes 70. The plurality of hard disks 80 are arranged in parallel at intervals. An arrangement direction of the hard disks is the same as an arrangement direction of the backplanes 70, and each hard disk 80 is connected to one side of the backplane 70. The plurality of controllers 90 are arranged in parallel at intervals. An arrangement direction of the controller intersects the arrangement direction of the backplanes 70. For example, the controller 90 and the backplane 70 are disposed orthogonally or disposed at a particular angle. In addition, each of the controllers 90 is connected to one side of the backplane 70 that is opposite to the hard disk 80, so that the hard disk 80 is connected to the controller 90 through the backplane 70.

The plurality of backplanes 70 are arranged in parallel at intervals, so that there is a channel 71 between adjacent backplanes 70, and an airflow can easily pass through the channel. This avoids blocking from the backplanes 70 to the airflow and achieves a good heat dissipation effect in the storage device. In addition, the direction of the backplanes 70 that are arranged in parallel at intervals is the same as the direction of the hard disks 80 that are arranged in parallel at intervals, and the hard disks 80 and the controllers 90 are connected to two opposite sides of the backplanes 70, respectively. Therefore, there is no need to reserve a clearance, and density of the hard disks 80 and/or the controllers 90 in the electronic device can be increased. Compared with the prior art, more hard disks 80 and controllers 90 can be connected through the backplanes 70, and an operating capability of the storage device can be improved.

Further, in some embodiments, each of the controllers 90 is connected to all the backplanes 70. In other words, each of the controllers 90 can access any hard disk 80 through the backplanes 70. In some embodiments, each of the backplanes 70 can be connected to all the controllers 90, so that a plurality of controllers 90 can access a same hard disk 80, so that connections of the plurality of controllers are implemented. Therefore, in the embodiments, the controllers 90 and the hard disks 80 may be deployed in a centralized storage architecture or distributed storage architectures. When the controllers 90 and the hard disks 80 are deployed in the centralized storage architecture, one piece of data is stored in one of the plurality of hard disks 80. In an embodiment, when a piece of data is stored in one hard disk 80, because a plurality of controllers 90 can access the same hard disk 80, a user that communicates with any controller 90 can obtain data from the same hard disk 80 or write data into the same hard disk 80. For example, in an embodiment, video data is written into a hard disk A, and a controller A, a controller B, and a controller C are all connected to the hard disk A through backplanes. In this case, all of the controller A, the controller B, and the controller C can read the video data information from the hard disk A. This means that a user can obtain the video data from the hard disk A through any one of the controller A, the controller B, or the controller C. When the controllers 90 and the hard disks 80 are deployed in the distributed storage architectures, one piece of data may be divided into a plurality of small pieces of data, a check code corresponding to each small piece of data is generated, and each small piece of data and the corresponding check code are separately stored in a plurality of hard disks. In the embodiments, because each controller 90 can be communicatively connected to all the backplanes 70 to access any hard disk 80 through the backplanes 70, any controller 90 can fan out an instruction to the plurality of hard disks 80 through the backplanes 70, to obtain small pieces of data from the plurality of hard disks 80, and can combine the small pieces of data obtained from the plurality of hard disks 80 into the complete data. Alternatively, one piece of data may be divided into a plurality of pieces of data and separately written the plurality of pieces of data into the plurality of hard disks 80. For example, video data of a user A is divided into video data 1, video data 2, and video data 3, and check codes, a check code 1, a check code 2, and a check code 3, corresponding to the video data 1, the video data 2 and the video data 3 are generated, respectively. Then, the video data 1 and the check code 1 are stored in a hard disk 1, the video data 2 and the check code 2 are stored in a hard disk 2, and the video data 3 and the check code 3 are stored in a hard disk 3. When a controller needs to read the video data, the controller may send a data reading instruction, and fan out the instruction to the hard disk 1, the hard disk 2, and the hard disk 3 through the backplanes, to obtain the video data 1, the video data 2, the video data 3, the check code 1, the check code 2, and the check code 3 from the three hard disks. Then, the controller processes, for example, combines, the video data 1, the video data 2, the video data 3, the check code 1, the check code 2, and the check code 3, to finally obtain the video data.

Figure 10:
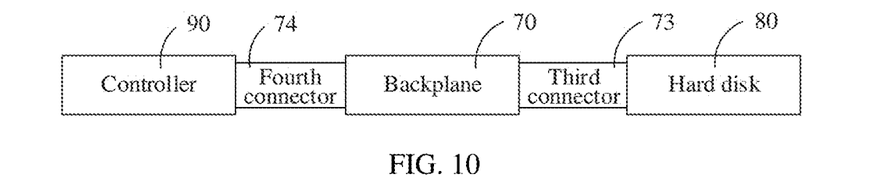
FIG. 10 is an architectural diagram of a storage device according to an embodiment.

Referring to FIG. 7 and FIG. 10, in some embodiments, the controller 90 is detachably connected to the backplane 70 through a fourth connector 74, and the hard disk 80 is detachably connected to the backplane 70 through a third connector 73, so that a user can flexibly configure a connection relationship between the hard disk 80 and the controller 90 based on a use requirement, and obtain different storage architectures. The third connector 73 is an embodiment of the first connector 13 in the electronic device, and the fourth connector 74 is an embodiment of the second connector 14 in the electronic device shown in FIG. 1. The fourth connector 74 and the controller 90 may be two independent components, or the fourth connector 74 may be a part of the controller 90. The third connector 73 and the hard disk 80 may also be two independent components, or the third connector 73 may be a part of the hard disk 80. The fourth connector 74 and the controller 90 may be two independent components. In other words, the fourth connector 74 and the controller 90 can also be detachably connected, to facilitate replacement of the fourth connector when the fourth connector 74 is damaged. The third connector 73 and the hard disk 80 can be two independent components. In other words, the third connector 73 and the hard disk 80 can also be detachably connected, to facilitate replacement of the third connector when the third connector 73 is damaged. For example, one end of the third connector 73 and one end of the fourth connector 74 are mounted on the backplane 70 in a through-board manner, and the other ends each have a plug-in interface. The controller 90 has a plug corresponding to the plug-in interface on the fourth connector 74 and is connected to the fourth connector 74 in a plugging manner. Similarly, the hard disk 80 has a plug corresponding to the plug-in interface on the third connector 73 and is connected to the third connector 73 in a plugging manner. It may be understood that, in other embodiments, the fourth connector 74 and the controller 90 or the third connector 73 and the hard disk 80 may alternatively be connected in a fixed manner.

Figure 11:
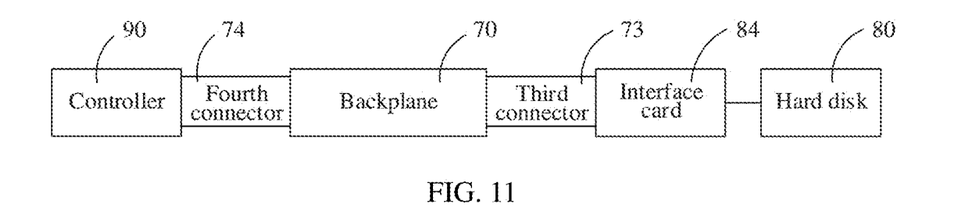
FIG. 11 is an architectural diagram of a storage device according to another embodiment.
Figure 12:
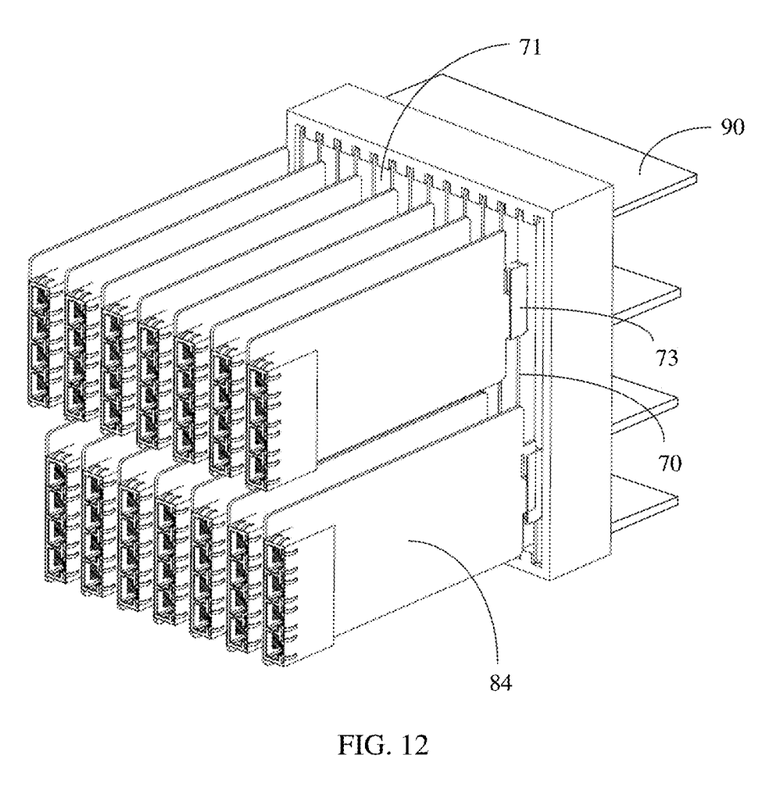
FIG. 12 is a structural diagram of the storage device according to the embodiment described in FIG. 11.

In the embodiments, a connection between the third connector 73 and the hard disk 80 may be a direct connection, or an indirect connection through an intermediate medium. Referring to FIG. 10, if the third connector 73 is directly connected to the hard disk 80, a signal can be directly transmitted from the hard disk 80 to the third connector 73. Referring to FIG. 11 and FIG. 12, a difference between the embodiments shown in FIG. 11 and FIG. 12 and the embodiment shown in FIG. 10 lies in: The third connector 73 is indirectly connected to the hard disk 80. For example, an interface card 84 (IO Card) providing an input/output (I/O) interface is alternatively connected between the third connector 73 and the hard disk 80, the interface card 84 is directly connected to the third connector 73 and is connected to the backplane 70 through the third connector 73. Then, the hard disk 80 is connected to the interface card 84 and is indirectly connected to the third connector 73 through the interface card 84. In this embodiment, the interface card 84 is an embodiment of the first unit 21 in the electronic device in FIG. 1. Locations and an arrangement of a plurality of interface cards 84 in the storage device, a connection manner between the interface cards and the backplanes, and the like are the same as locations and an arrangement of the hard disks 80 in the storage device and a connection manner between the hard disks and the backplanes in the embodiment shown in FIG. 10. In addition, in this embodiment, the interface card 84 is connected to the hard disk 80. It may be understood that, in some embodiments, the hard disk 80 may be a part of the storage device. In some other embodiments, the hard disk 80 may alternatively be an external structure of the storage device, to facilitate replacement of the hard disk 80. For example, the storage device in this embodiment is connected to an external hard disk array, where the external hard disk array includes hard disks 80 disposed in an array. The hard disk array is connected to an I/O interface of the interface card 84 through a cable, so that the external disk array is connected to the storage device. When a hard disk 80 needs to be replaced, only the cable connecting the hard disk array and the I/O interface of the interface card 84 needs to be removed from the I/O interface, and a new disk array is mounted.

The I/O interface may be an interface that may be connected to a host server, such as a fiber channel (FC) interface, an internet small computer system interface (ISCSI), or an infiniband (IB) interface, or may be an interface that is connected to a rear hard disk 80, such as a 6G/12G serial attached small computer system interface (Serial Attached SCSI). In addition, in other embodiments, based on an actual requirement, other structures can be connected to the backplane 70 through the interface of the interface card 84 and communicatively connected to the controller 90. In an embodiment, the third connector 73 is a Gen-Z 4C connector, and the fourth connector 74 is an orthogonal enterprise and data center SSD form factor ( ) female elbow. Both the third connector 73 and the fourth connector 74 are mounted on the backplane 70 in a through-board manner, so that the third connector 73 is stably fastened on the backplane 70. The fourth connector 74 is the orthogonal EDSFF female elbow.

The controller 90 is described in detail below.

Figure 13:
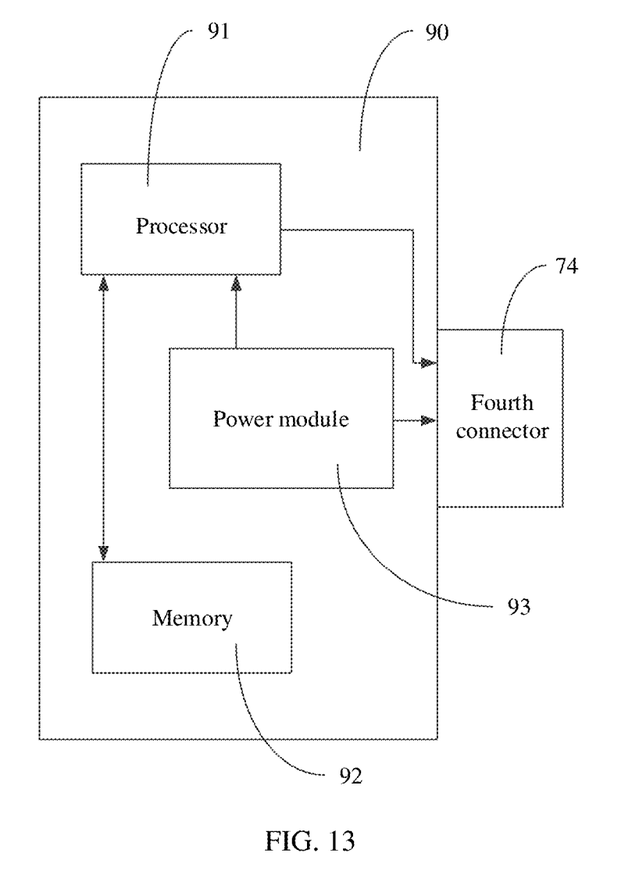
FIG. 13 is a schematic structural diagram of a controller and a second connector in a storage device according to an embodiment.

Referring to FIG. 13, a controller 90 may include a processor 91. The processor 91 is communicatively connected to a fourth connector 74. The processor may be a central processing unit (CPU), a digital signal processor, an application-specific integrated circuit, a field-programmable gate array (FPGA), or other programmable logic devices. This is not limited herein. The processor 91 is configured to implement service data transmission between the controller and a hard disk 80, to obtain data stored in the hard disk 80 or store to-be-stored data in the hard disk 80. Further, the processor may detect a connection state (connected or disconnected) between the hard disk 80 and a backplane 70, detect whether the hard disk 80 is faulty, detect information about the hard disk 80, and control a power supply state or a connection state of the hard disk 80. Further, the controller 90 may include a memory 92 and a power module 93. The memory 92 is connected to the processor 91 and is configured to provide a cache function for the processor 91 during communication between the processor 91 and the hard disk 80. The power module 93 is electrically connected to the processor 91 and the fourth connector 74 to provide an operating voltage for the processor 91 and the hard disk 80 that is communicatively connected to the controller 90 through the fourth connector 74, the backplane 70, and a third connector 73.

The hard disk 80 is described in detail below.

Figure 14:
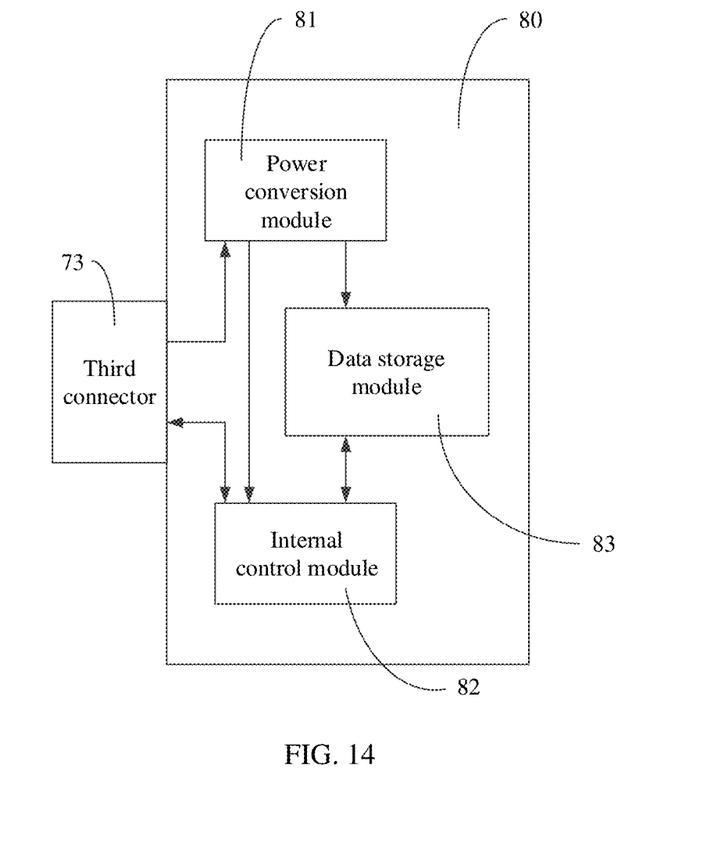
FIG. 14 is a schematic structural diagram of a hard disk and a first connector in a storage device according to an embodiment.

Referring to FIG. 14, a hard disk 80 may include a power conversion module 81, an internal control module 82, and a data storage module 83. The power conversion module 81 is electrically connected to a third connector 73, the internal control module 82, and the data storage module 83. The power conversion module 81 is electrically connected to the third connector 73, to implement electrical connection to a power module 93 in a controller 90. The power conversion module 81 converts a voltage provided by the power module 93 in the controller 90 into an operating voltage suitable for the internal control module 82 and the data storage module 83, to supply power to the internal control module 82 and the data storage module 83. The internal control module 82 is configured to process a signal of the controller 90 and manage the hard disk 80. For example, the internal control module 82 receives a control signal of the controller 90 for the hard disk 80 and provides a function of reading data form the data storage module 83 or writing data into the data storage module 83. In this embodiment, the hard disk 80 is directly connected to the third connector 73. It may be understood that, in other embodiments, the hard disk 80 may be indirectly connected to the third connector 73. The data storage module 83 is configured to store or read user data under a control of the internal control module 82. In some embodiments, the data storage module 83 may be a CPU, a digital signal processor, an application-specific integrated circuit, an FPGA, or other programmable logic devices. This is not limited herein.

In some embodiments, the electronic device may alternatively be a switch or a router. When the electronic device is a switch, the first unit 21 is a switching matrix card, and the second unit 31 is a service line card. When the electronic device with parallel backplanes is a router, the first unit 21 is a network board and an interface card, and the second unit 31 is a main control board.

The storage device provided in the embodiments has a structure including the plurality of backplanes 70 arranged in parallel at intervals and the channel 71 between adjacent backplanes 70, so that an airflow for heat dissipation can easily pass through the channel 71. This avoids blocking from the backplanes 70 to the airflow for heat dissipation and avoids impact of density of the controllers 90 and/or the hard disks 80 in the storage device on the airflow for heat dissipation. Compared with a manner in the prior art in which a through-hole is disposed on a backplane 70 in a storage device for heat dissipation, in this embodiment, an air ventilation effect in the storage device is better, and a better heat dissipation effect is achieved in the storage device. In addition, the controllers 90 and the hard disks 80 are disposed on two opposite sides in a non-thickness direction of the backplanes 70, respectively, and therefore there is no need to reserve a clearance for the hard disks 80 and the controllers 90 on the two sides of the backplanes 70. In this way, as many hard disks 80 and controllers 90 as possible can be connected through the backplanes 70, density of the hard disks 80 and/or the controllers 90 in the storage device can be increased, and the following prior-art problem does not arise: a heat dissipation effect in the storage device is poor because the density of the hard disks 80 and/or the controllers 90 in the storage device is increased and a size of the through-hole for heat dissipation on the backplane 70 needs to be reduced.

It should be noted that a person of ordinary skill in the art may still make several improvements or enhancements without departing from the principle of the embodiments and the improvements or enhancements are envisioned within the scope of the embodiments.

What is claimed is:

1. An electronic device with parallel backplanes, comprising: a backplane assembly, a front inserting assembly, and a rear inserting assembly, wherein the backplane assembly is connected to the front inserting assembly and the rear inserting assembly; the backplane assembly comprises a plurality of backplanes arranged in parallel at intervals, and there is a channel between adjacent backplanes; the front inserting assembly comprises a plurality of first units arranged in parallel at intervals, an arrangement direction of the first units is the same as an arrangement direction of the backplanes, and the first unit is connected to one side of the backplane; and the rear inserting assembly comprises a plurality of second units arranged in parallel at intervals, an arrangement direction of the plurality of second units intersects the arrangement direction of the plurality of backplanes, and each of the second units is connected to one side of the backplane that is opposite to the first unit, so that the first unit is connected to the second unit through the backplane.

2. The electronic device with the parallel backplanes according to claim 1, wherein each of the second units is connected to all the backplanes.

3. The electronic device with the parallel backplanes according to claim 1, wherein each of the backplanes is connected to all the second units.

4. The electronic device with the parallel backplanes according to claim 1, wherein the first units connected to adjacent backplanes are staggered in a height direction of the backplanes.

5. The electronic device with the parallel backplanes according to claim 1, wherein an electronic component is disposed on the backplane.

6. The electronic device with the parallel backplanes according to claim 1, wherein the backplane comprises a first side and a second side opposite to the first side, the front inserting assembly is connected to the first side, and the rear inserting assembly is connected to the second side.

7. The electronic device with the parallel backplanes according to claim 6, wherein each first side is disposed with a first connector, each second side is disposed with a second connector, a side of the first unit facing the backplane is disposed with a first connection port, and the first connection port is detachably connected to the first connector; and a side of the second unit facing the backplane is disposed with a second connection port, and the second connection port is detachably connected to the second connector.

8. The electronic device with the parallel backplanes according to claim 7, wherein both the first connector and the second connector are mounted on the backplane in a through-board manner.

9. The electronic device with the parallel backplanes according to claim 1, wherein the backplane assembly further comprises a fixed frame with openings on two sides, the openings face the front inserting assembly and the rear inserting assembly, respectively, and the backplane is detachably fastened in the fixed frame.

10. The electronic device with the parallel backplanes according to claim 9, wherein an inner wall of the fixed frame is disposed with a plurality of card slots arranged at intervals, and an edge of each of the backplanes is secured in corresponding card slot.

11. The electronic device with the parallel backplanes according to claim 9, wherein a buffer member is disposed between the inner wall of the card slot and the backplane.

12. The electronic device with the parallel backplanes according to claim 1, wherein the backplane is disposed with a hole.

13. The electronic device with the parallel backplanes according to claim 12, wherein projections of holes on adjacent backplanes overlap on a plane parallel to any of the backplanes.

14. The electronic device with the parallel backplanes according to claim 1, wherein the electronic device with parallel backplanes further comprises a chassis, and the backplane assembly, the front inserting assembly, and the rear inserting assembly are all accommodated in the chassis.

15. The electronic device with the parallel backplanes according to claim 14, wherein a heat dissipation fan is disposed on a wall of the chassis, the heat dissipation fan is located on one side of the rear inserting assembly, and an airflow generated by the heat dissipation fan sequentially passes through the rear inserting assembly, the backplane assembly, and the front inserting assembly.

16. A storage device, comprising:

a plurality of backplanes arranged in parallel at intervals, wherein there is a channel between adjacent backplanes;

a plurality of interface cards arranged in parallel at intervals, wherein an arrangement direction of the plurality of interface cards is the same as an arrangement direction of the backplanes, the interface card is connected to one side of the backplane, and the interface card is configured to connect a hard disk; and a plurality of controllers arranged in parallel at intervals, wherein an arrangement direction of the plurality of controllers intersect the arrangement direction of the plurality of backplanes, and each of the controllers is connected to one side of the backplane that is opposite to the interface card, so that the controller is connected to the hard disk connected to the interface card.

17. The storage device according to claim 16, wherein each of the controllers is connected to all the backplanes.

18. The storage device according to claim 16, wherein each of the backplanes is connected to all the controllers.

19. The storage device according to claim 16, wherein interface cards connected to adjacent backplanes are staggered in a height direction of the backplanes.

20. The storage device according to claim 16, wherein an electronic component is disposed on the backplane.

* * * * *